(12) United States Patent
Yang et al.

(10) Patent No.: US 11,369,041 B2
(45) Date of Patent: Jun. 21, 2022

(54) LIQUID COOLING MANIFOLD

(71) Applicant: Delta Electronics, Inc., Taoyuan (TW)

(72) Inventors: Ming-Tang Yang, Taoyuan (TW); Teng-Chiao Shen, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 17/138,520

(22) Filed: Dec. 30, 2020

(65) Prior Publication Data

US 2022/0046823 A1 Feb. 10, 2022

(30) Foreign Application Priority Data

Aug. 6, 2020 (CN) .......................... 202010780785.4

(51) Int. Cl.
*H05K 7/20* (2006.01)

(52) U.S. Cl.
CPC ..... *H05K 7/20272* (2013.01); *H05K 7/20409* (2013.01)

(58) Field of Classification Search
None
See application file for complete search history.

(56) References Cited

U.S. PATENT DOCUMENTS

| | | | |
|---|---|---|---|
| 6,793,121 B2 * | 9/2004 | Nitta | F28F 9/0253 228/138 |
| 7,178,586 B2 | 2/2007 | Goldman et al. | |
| 7,757,642 B2 | 7/2010 | Rettig et al. | |
| 8,867,205 B2 * | 10/2014 | Eagle | H05K 7/20254 361/689 |
| 9,281,547 B2 * | 3/2016 | Maguire | B60L 50/64 |
| 10,995,998 B2 * | 5/2021 | Penny | F28D 21/0003 |
| 2016/0270260 A1 * | 9/2016 | Franz | H05K 7/20272 |
| 2021/0267095 A1 * | 8/2021 | Heydari | H05K 7/2079 |

FOREIGN PATENT DOCUMENTS

| | | |
|---|---|---|
| CN | 103855916 A | 6/2014 |
| CN | 205183102 U | 4/2016 |
| CN | 105704989 A | 6/2016 |
| CN | 107932008 A | 4/2018 |
| CN | 110544803 A | 12/2019 |
| TW | I445289 B | 7/2014 |
| TW | 201442608 A | 11/2014 |
| TW | 201544765 A | 12/2015 |
| TW | 202023350 A | 6/2020 |

* cited by examiner

*Primary Examiner* — Courtney L Smith
(74) *Attorney, Agent, or Firm* — Kirton McConkie; Evan R. Witt

(57) ABSTRACT

The present disclosure provides a liquid cooling manifold. The liquid cooling manifold includes a channel body and a plurality of fluid connectors. The channel body includes a base, a wall portion and a fixing portion. The wall portion is connected between the base and the fixing portion, and a fluid channel is formed among the base, the wall portion and the fixing portion. The fixing portion includes a plurality of fixing openings respectively in fluid communication with the fluid channel. The plurality of fluid connectors are respectively disposed on the fixing portion and fixed to the corresponding one of the plurality of fixing openings and respectively in fluid communication with the fluid channel.

16 Claims, 11 Drawing Sheets

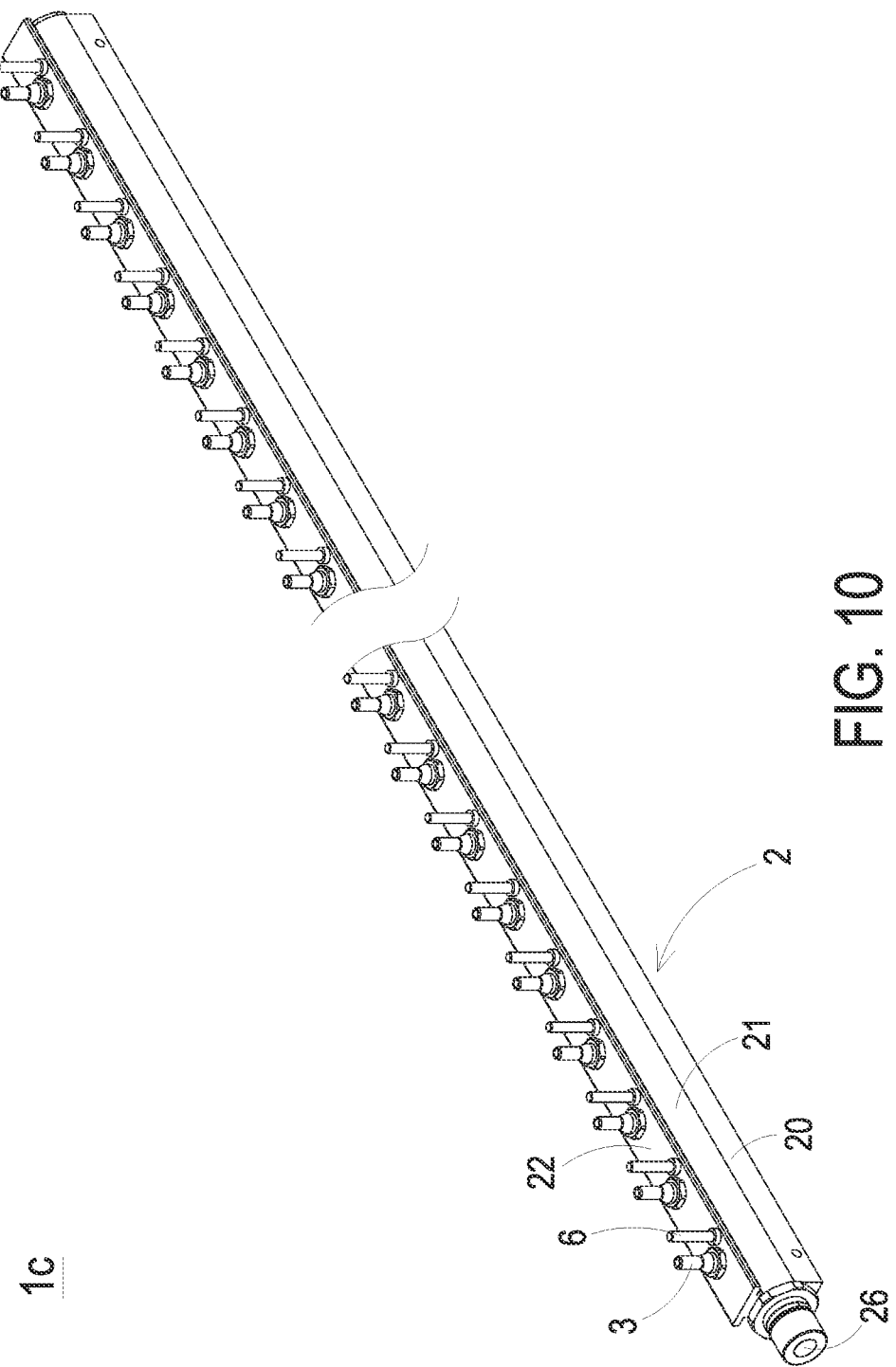

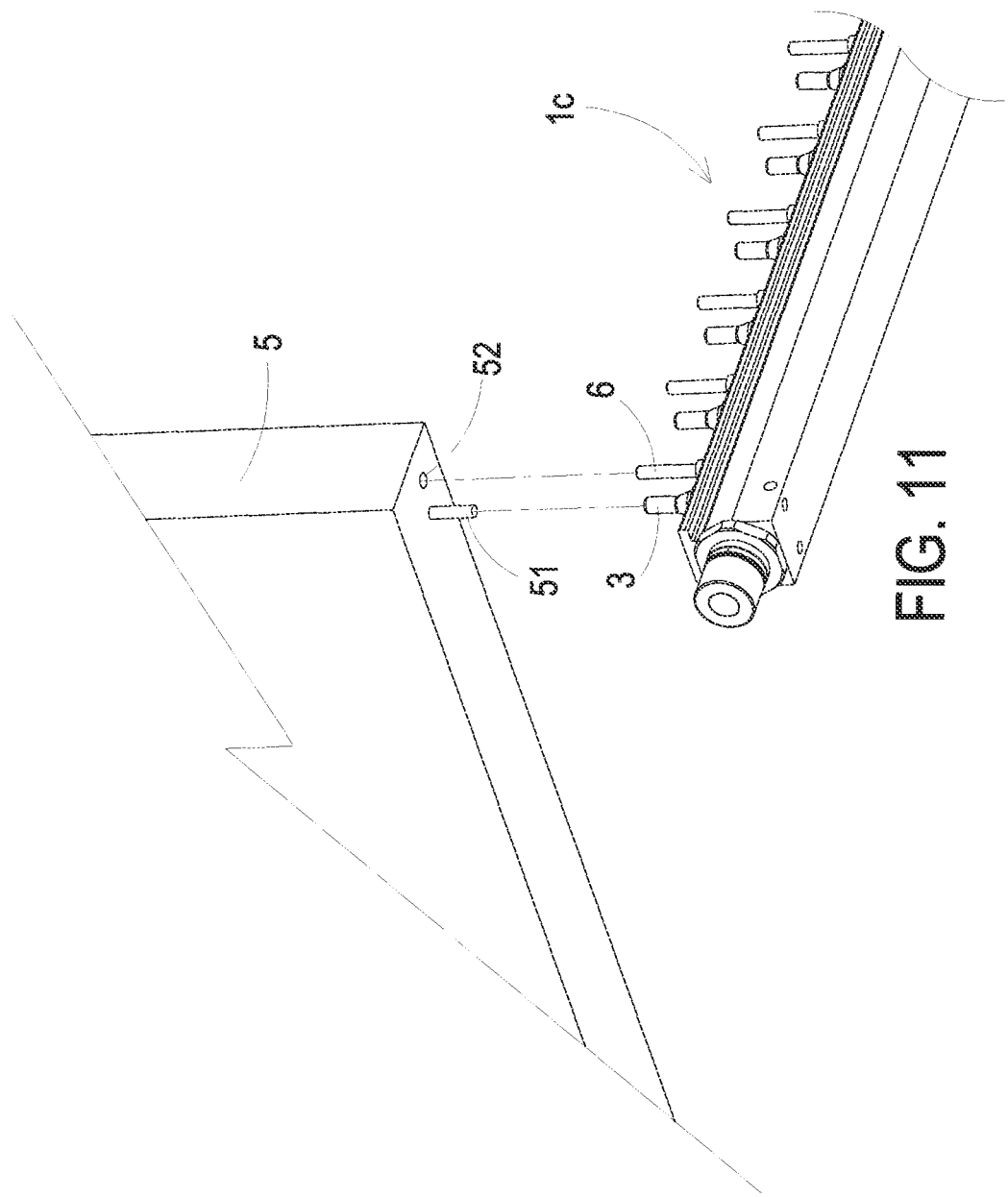

LIQUID COOLING MANIFOLD

CROSS-REFERENCE TO RELATED APPLICATION

This application claims priority to China Patent Application No. 202010780785.4, filed on Aug. 6, 2020. The entire contents of the above-mentioned patent application are incorporated herein by reference for all purposes.

FIELD OF THE INVENTION

The present disclosure relates to a manifold, and more particularly to a liquid cooling manifold.

BACKGROUND OF THE INVENTION

Nowadays, the liquid cooling system is widely used in the data center or the telecommunication equipment and configured to actively dissipate heat generated by the electronic device (e.g., a server, a network switch or a storage device) disposed within the equipment. Generally, the liquid cooling system includes a pump to drive the cooling liquid to circulate within a liquid cooling manifold, and allows the cooling liquid in the liquid cooling manifold to conduct heat exchange with the electronic device to transfer thermal energy continuously. Consequently, heat dissipation of the electronic device is achieved.

However, the conventional liquid cooling manifold is made of commercially available metal pipe and processed according to the required structural features. For instance, the commercially available metal pipe of the liquid cooling manifold has a thin and uniform pipe wall. In order to provide branch pipelines, it is necessary to drill and tap the pipe wall of the liquid cooling manifold to form screw holes and then connect the branch pipelines to the metal pipe. The thickness of the pipe wall of the liquid cooling manifold is thin, and the height of a fixing portion of the branch pipeline (e.g., 14 mm) is greater than the thickness of the pipe wall of the liquid cooling manifold (e.g., 10 mm). When the fixing portion of the branch pipeline is required to be fixed in a corresponding screw hole of the liquid cooling manifold, the depth of the screw hole is insufficient, so that an adapter having a screw hole with internal thread is necessary to be welded on the pipe wall of the liquid cooling manifold and corresponding in position to the screw hole. Consequently, the branch pipeline can be fixed to the pipe wall of the liquid cooling manifold by the auxiliary of the adapter. In addition, in order to fix the liquid cooling manifold to an object, one or more fixing parts are also necessary to be welded on the periphery of the pipe wall of the liquid cooling manifold. Obviously, multiple welding procedures are performed on the liquid cooling manifold, so that the thermal deformation of the pipe wall may be caused readily. Moreover, as the adapter is jointed to the liquid cooling manifold, liquid leakage may occur due to poor welding. Furthermore, the assembly of the liquid cooling manifold requires multiple components, which causes complicated structure, high costs and poor precision due to the accumulated tolerance.

Therefore, there is a need of providing an improved liquid cooling manifold to obviate the drawbacks of the prior art.

SUMMARY OF THE INVENTION

It is an object of the present disclosure to provide a liquid cooling manifold. By disposing the fixing portion of the channel body, the fluid connectors are fixed to the channel body directly, so that adapters used in the conventional liquid cooling manifold are omitted and the welding process needn't to be performed. Consequently, the thermal deformation caused by the welding process is avoided, the impact of accumulated tolerance is reduced, and the advantages of preventing liquid leakage and enhancing precision are achieved.

It is an object of the present disclosure to provide a liquid cooling manifold. The liquid cooling manifold is applicable to a liquid cooling system and configured to receive and transport a cooling liquid. The liquid cooling manifold includes a channel body and a plurality of fluid connectors. The channel body includes a base, a wall portion and a fixing portion. The wall portion is connected between the base and the fixing portion. A fluid channel is formed among the wall portion, the base and the fixing portion. The fluid channel allows the cooling liquid to flow therethrough. The fixing portion includes a first surface and a plurality of fixing openings. The plurality of fixing openings penetrate through the first surface and are respectively in fluid communication with the fluid channel. The plurality of fluid connectors are respectively disposed on the fixing portion and fixed to the corresponding one of the plurality of fixing openings and respectively in fluid communication with the fluid channel.

The above contents of the present invention will become more readily apparent to those ordinarily skilled in the art after reviewing the following detailed description and accompanying drawings, in which:

BRIEF DESCRIPTION OF THE DRAWINGS

FIG. 10 is a partially enlarged schematic perspective view illustrating a liquid cooling manifold according to a fourth embodiment of the present disclosure; and FIG. 11 is a schematic perspective view illustrating the liquid cooling manifold of FIG. 10 in connection with an electronic device.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
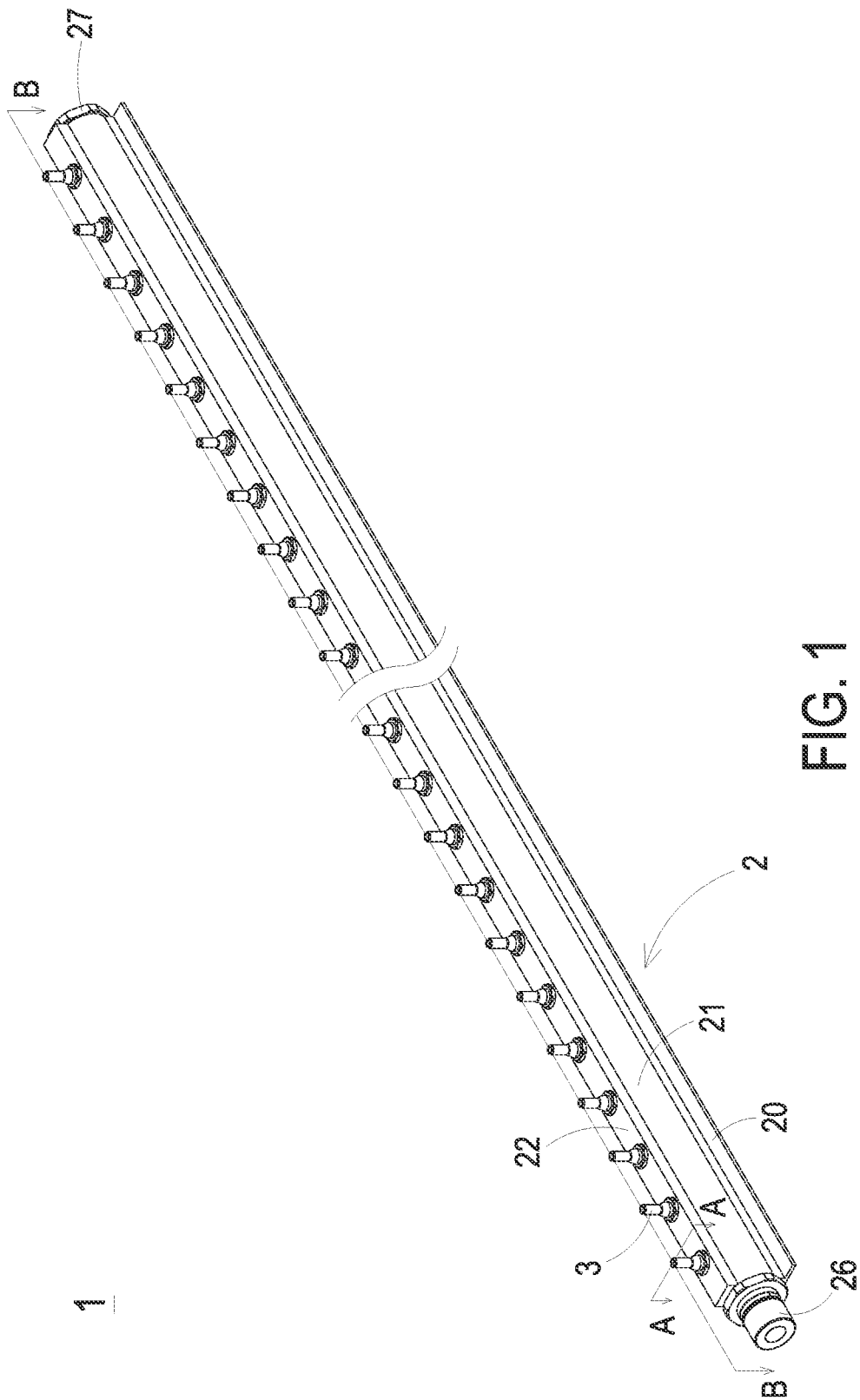
FIG. 1 is a schematic perspective view illustrating a liquid cooling manifold according to a first embodiment of the present disclosure.
Figure 2:
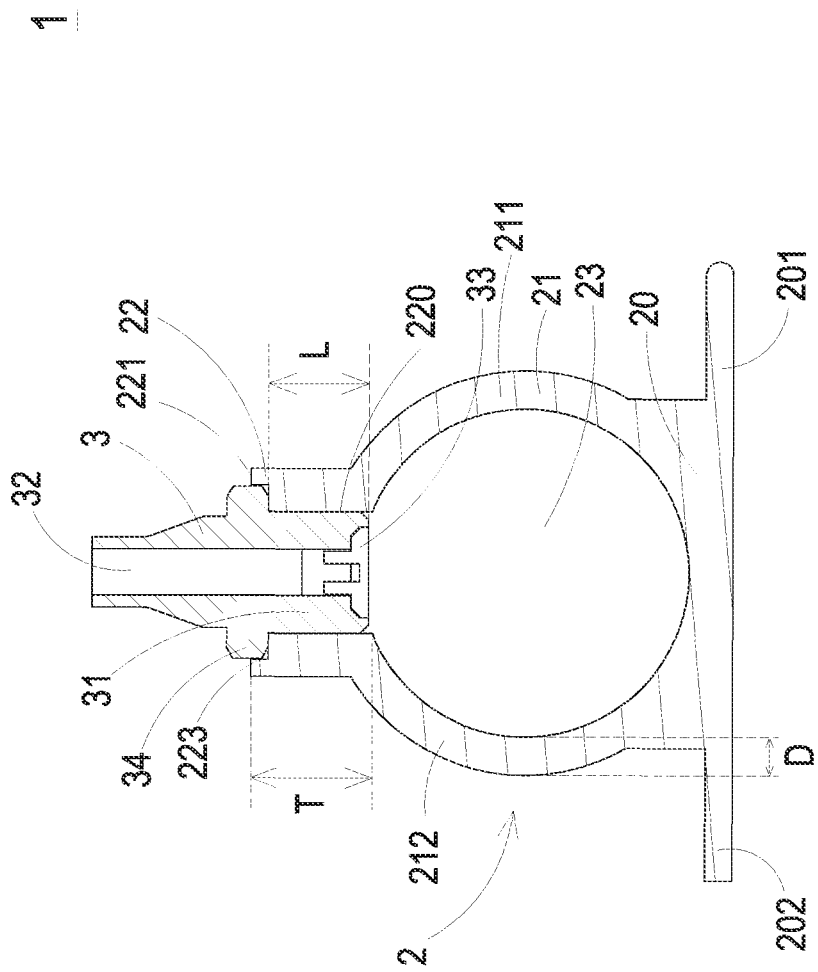
FIG. 2 is a schematic cross-sectional view illustrating the liquid cooling manifold of FIG. 1 and taken along the line A-A.
Figure 3:
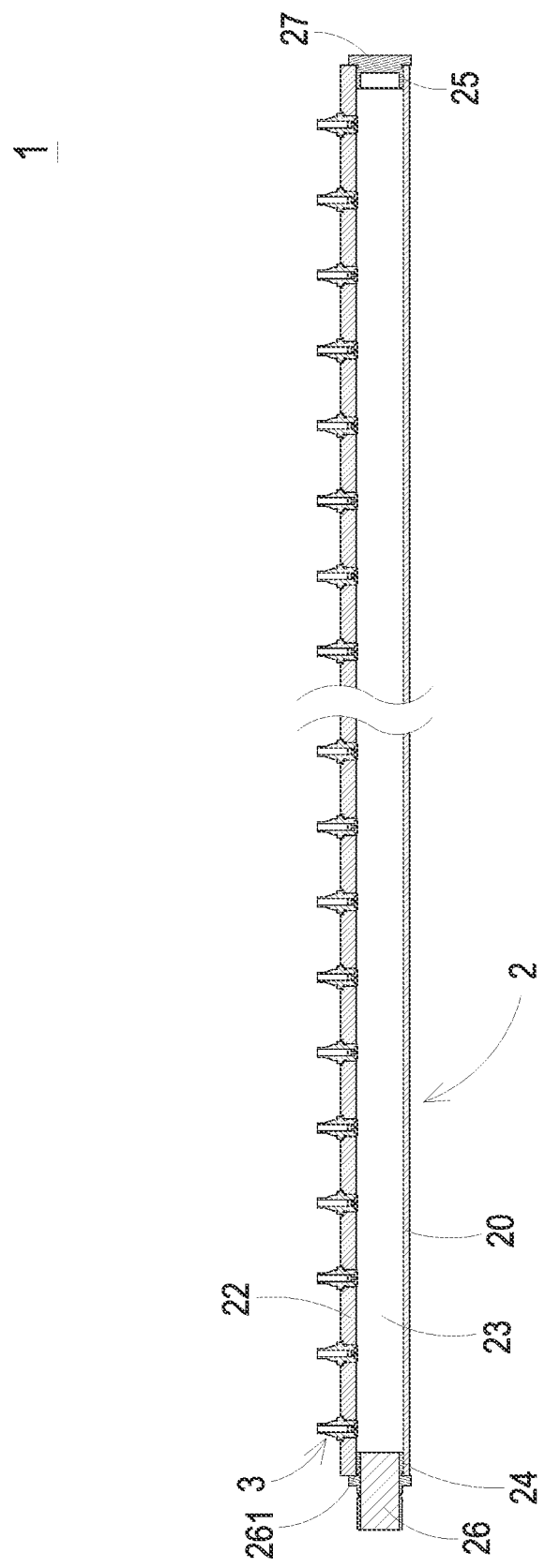
FIG. 3 is a schematic cross-sectional view illustrating the liquid cooling manifold of FIG. 1 and taken along the line B-B.
Figure 4:
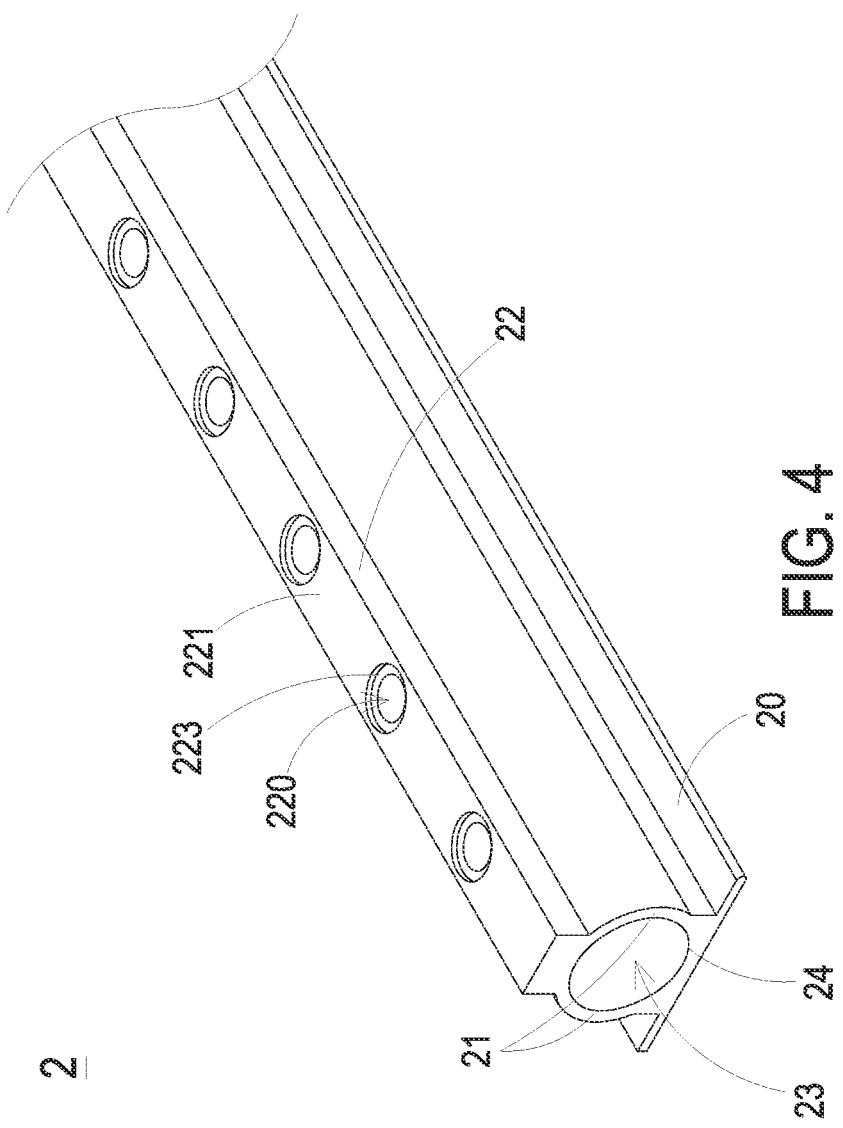
FIG. 4 is a partially enlarged schematic perspective view illustrating the channel body of the liquid cooling manifold of FIG. 1.

FIG. 1 is a schematic perspective view illustrating a liquid cooling manifold according to a first embodiment of the present disclosure, FIG. 2 is a schematic cross-sectional view illustrating the liquid cooling manifold of FIG. 1 and taken along the line A-A, FIG. 3 is a schematic cross-sectional view illustrating the liquid cooling manifold of FIG. 1 and taken along the line B-B, and FIG. 4 is a partially enlarged schematic perspective view illustrating the channel body of the liquid cooling manifold of FIG. 1. The liquid cooling manifold 1 of the present disclosure is detachably mounted on a rack (not shown) of a data center or a telecommunication equipment, but not limited thereto. The liquid cooling manifold 1 is vertically or horizontally mounted on the rack. In the embodiment, the liquid cooling manifold 1 is applicable to a liquid cooling system and configured to receive cooling liquid and transport and distribute the cooling liquid to one or a plurality of electronic devices, for example but not limited to a server, a network switch or a storage device. Consequently, the liquid cooling manifold 1 conducts heat exchange with the electronic devices to achieve the actively heat dissipation. Alternatively, the liquid cooling manifold 1 converges the cooling liquid passing through one or the plurality of electronic devices and transport and discharge the cooling liquid. The liquid cooling manifold 1 of the present disclosure includes a channel body 2 and a plurality of fluid connectors 3. The channel body 2 is an elongated tube structure and includes a base 20, a wall portion 21 and a fixing portion 22. The wall portion 21 is connected between the base 20 and the fixing portion 22. A fluid channel 23, a first end opening 24 and a second end opening 25 are formed among the base 20, the wall portion 21 and the fixing portion 22. The fluid channel 23 is in fluid communication with the first end opening 24, the first end opening 24 is served as an inlet or an outlet of the liquid cooling manifold 1 for flowing the cooling liquid, and the fluid channel 23 allows the cooling liquid to flow therethrough. The fixing portion 22 includes a first surface 221 and a plurality of fixing openings 220. The plurality of fixing openings 220 penetrate through the first surface 221 of the fixing portion 22 and are respectively in fluid communication with the fluid channel 23. The plurality of fixing openings 221 are served as inlets or outlets of a plurality of branch channels. The plurality of fluid connectors 3 are respectively disposed on the fixing portion 22 and fixed to the corresponding one of the plurality of fixing openings 220. The plurality of fluid connectors 3 are respectively in fluid communication with the fluid channel 23 and allow the cooling liquid to pass through the fluid connectors 3 selectively. In the embodiment, when the fluid connector 3 is assembled with a matching fluid connector (not shown), the fluid connector 3 is opened and allows the cooling liquid to pass through the fluid connector 3 and the matching fluid connector, so that the cooling liquid can be transported to the branch channel. When the fluid connector 3 is disassembled from the matching fluid connector, the fluid connector 3 is closed and limits the cooling liquid to pass through the fluid connector 3 and the matching fluid connector, so that the cooling liquid is limited to be transported to the branch channel.

In this embodiment, the channel body 2 is a metal extrusion structure integrally formed in one piece. Preferably, the channel body 2 is an aluminum extrusion structure integrally formed in one piece. The base 20 includes a first extension portion 201 and a second extension portion 202. The first extension portion 201 and the second extension portion 202 are protruded outwardly from two opposite sides of the base 20. A bottom surface of the base 20 is coplanar with a bottom surface of the first extension portion 201 and a bottom surface of the second extension portion 202. In an embodiment, the first extension portion 201 and the second extension portion 202 are processed according to the practical requirements. For instance, a plurality of fastening holes or screw holes are formed in the first extension portion 201 and the second extension portion 202, so that the channel body 2 can be mounted on the rack by fixing elements, for example but not limited to screws or rivets. In some embodiments, the first extension portion 201 and the second extension portion 202 of the base 20 are mounted on the rack by engaging the first extension portion 201 and the second extension portion 202 with the engaging grooves of the rack. It is noted that the manner of mounting the first extension portion 201 and the second extension portion 202 of the base 20 on the rack is not limited to the foregoing embodiment, and can be varied according to the practical requirements.

In the embodiment, the wall portion 21 includes a first sidewall 211 and a second sidewall 212. The first sidewall 211 is connected between the base 20 and the fixing portion 22 and is a curved wall. The second sidewall 212 is connected between the base 20 and the fixing portion 22 and is a curved wall. The first sidewall 211 and the second sidewall 212 have the same thickness D. The fluid channel 23, the first end opening 24 and the second end opening 25 are formed among the base 20, the first sidewall 211, the second sidewall 212 and the fixing portion 22. The fluid channel 23 is a cylindrical channel, but not limited thereto. The cylindrical channel reduces the turbulence of the cooling liquid, and achieves the effect of reducing the flow resistance. The fixing portion 22 is in connection with a side of the first sidewall 211 and a side of the second sidewall 212, and the fixing portion 22 has a first surface 221 and a thickness T. The first surface 221 of the fixing portion 22 is parallel to the bottom surface of the base 20. The plurality of fixing openings 220 penetrate through the first surface 221 of the fixing portion 22 and are respectively in fluid communication with the fluid channel 23. The plurality of fixing openings 220 are served as inlets or outlets of the branch channels. The thickness T of the fixing portion 22 is greater than the thickness D of the first sidewall 211 and the second sidewall 212. The thickness T of the fixing portion 22 is greater than or equal to a length L of a fixing part 31 of the fluid connector 3. In the embodiment, by disposing the fixing portion 22 of the channel body 2, the plurality of fluid connectors 3 are fixed to the channel body 2 directly, so that the adapters used in conventional cooling liquid manifold are omitted and the welding process needn't to be performed. Consequently, the thermal deformation of the channel body 2 caused by multiple welding processes are avoided, the impact of accumulated tolerance is reduced, and the advantages of preventing liquid leakage and enhancing precision are achieved.

In an embodiment, the fixing opening 220 is a screw hole with internal thread. The fluid connector 3 includes a fixing part 31 with external thread. By screwing the fixing part 31 of the fluid connector 3 into the corresponding fixing opening 220 directly, the fluid connector 3 is fixed to the corresponding fixing opening 220 and seals the corresponding fixing opening 220. It is noted that the manner of fixing the fluid connector 3 to the corresponding fixing opening 220 is not limited to the foregoing embodiment, and can be varied according to the practical requirements. In some embodiments, the liquid cooling manifold 1 further includes a plurality of first sealing rings (not shown). The plurality of first sealing rings are positioned in the corresponding one of the plurality of fixing openings 220. When the fluid connector 3 is fixed to the corresponding fixing opening 220, the first sealing ring is disposed between the fluid connector 3 and the fixing opening 220, so as to enhance the sealing effect and prevent the leakage of cooling liquid. The first sealing ring is made of rubber, but not limited thereto. In the embodiment, the plurality of fixing openings 220 are arranged linearly along the longitudinal direction on the first surface 221 of the fixing portion 22, and any two adjacent fixing openings 220 are spaced apart at same interval, but not limited thereto.

In the embodiment, preferably but not exclusively, the first end opening 24 of the channel body 2 is a circle opening. The first end opening 24 is in fluid communication with the fluid channel 23. The liquid cooling manifold 1 further includes a port connector 26. The port connector 26 is tightly fitted in with the first end opening 24, so that the port connector 26 is fixed to the first end opening 24 and seals the first end opening 24. The port connector 26 allows the cooling liquid to pass through the port connector 26 selectively. In other embodiment, the port connector 26 includes a fixing part 261. The fixing part 261 is a cylinder with external thread. An end of the inner wall of the channel body 2 adjacent to the first end opening 24 has internal thread. By screwing the fixing part 261 of the port connector 26 into the end of the inner wall of the channel body 2 adjacent to the first end opening 24, the port connector 26 is directly fixed to the first end opening 24 of the channel body 2 and in fluid communication with the fluid channel 23, so that an adapter having screw hole with internal thread is omitted and the welding process needn't to be performed. Since the port connector 26 and the channel body 2 can be directly assembled with each other, the thermal deformation of the channel body 2 caused by welding process is avoided, the impact of accumulated tolerance is reduced, and the advantages of preventing liquid leakage and enhancing precision are achieved. In some embodiments, the liquid cooling manifold 1 further includes a second sealing ring (not shown). The second sealing ring is positioned on the first end opening 24 of the channel body 2. When the port connector 26 is fixed to the first end opening 24 of the channel body 2, the second sealing ring is disposed between the port connector 26 and the channel body 2, so as to enhance the sealing effect and prevent the leakage of cooling liquid. The second sealing ring is made of rubber, but not limited thereto.

In the embodiment, preferably but not exclusively, the second end opening 25 of the channel body 2 is a circle opening. The second end opening 25 is in fluid communication with the fluid channel 23. The liquid cooling manifold 1 further includes a port cover 27. The port cover 27 is tightly fitted in with the second end opening 25, so that the port cover 27 is fixed to the second end opening 25 and seals the second end opening 25.

In an embodiment, the fluid connector 3 includes a connecting channel 32 and a valve 33. The valve 33 is configured to movably close an end of the connecting channel 32 of the fluid connector 3, so as to allow or limit the cooling liquid to flow between the connecting channel 32 and the fluid channel 23. When the fluid connector 3 of the liquid cooling manifold 1 is assembled with a matching fluid connector (not shown), the valve 33 of the fluid connector 3 is pressed to be opened and allows the cooling liquid to pass through the fluid connector 3 and the matching fluid connector, so that the cooling liquid can be transported through the branch channel. When the fluid connector 3 of the liquid cooling manifold 1 is disassembled from the matching fluid connector, the valve 33 of the fluid connector 3 is return to the original position to close the connecting channel 32, so as to limit the cooling liquid to flow through the fluid connector 3 and the matching fluid connector. Consequently, the cooling liquid is limited to be transported through the branch channel. It is noted that the structure of the fluid connector 3 is not limited to the foregoing embodiment, any existing or well-known fluid connectors can be incorporated herein for reference, and can be varied according to the practical requirements. In the embodiment, the number of the plurality of fluid connectors 3 is equal to the number of the plurality of fixing openings 220.

Please refer to FIGS. 2 and 4. In an embodiment, the fixing portion 22 further includes a plurality of recesses 223. The plurality of recesses 223 are respectively disposed on the first surface 221 of the fixing portion 22 and corresponding in position to the corresponding one of the plurality of fixing openings 220. Each of the recesses 223 is in fluid communication with the corresponding one of the plurality of fixing openings 220, and a diameter of the recess 223 is greater than a diameter of the corresponding fixing opening 220. The fluid connector 3 further includes a fixing ring 34. The fixing ring 34 is connected adjacent to an end of the fixing part 31, and extended outwardly from a central portion of the fluid connector 3. When the fluid connector 3 is fixed to the corresponding one of the plurality of fixing openings 220, the fixing ring 34 of the fluid connector 3 is tightly fitted in with the corresponding one of the plurality of recesses 223 so as to seal the corresponding fixing opening 220.

Figure 5:
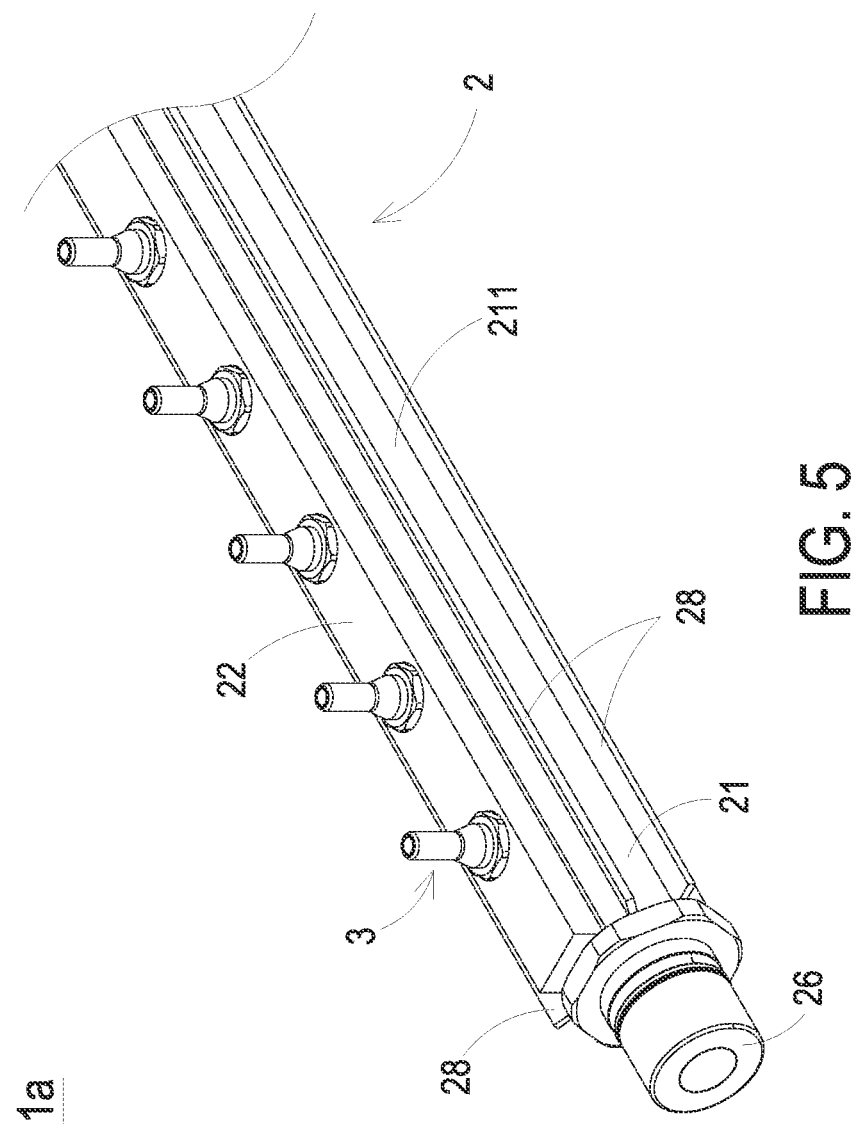
FIG. 5 is a schematic perspective view illustrating a liquid cooling manifold according to a second embodiment of the present disclosure.

FIG. 5 is a schematic perspective view illustrating a liquid cooling manifold according to a second embodiment of the present disclosure. The structures and functions of the liquid cooling manifold 1a of the second embodiment are similar to those of the liquid cooling manifold 1 shown in FIGS. 1 to 4. Component parts and elements corresponding to those of the first embodiment are designated by identical numeral references, and detailed descriptions thereof are omitted. In the embodiment, the channel body 2 of the liquid cooling manifold 1a further includes a plurality of heat-dissipating fins 28. The plurality of heat-dissipating fins 28 are extended outwardly from an outer surface of the wall portion 21 of the channel body 2. The plurality of heat-dissipating fins 28 are extended outwardly from an outer surface of the first sidewall 211 and an outer surface of the second sidewall 212, respectively. Consequently, the heat dissipating area of the channel body 2 is increased and the heat dissipation efficiency is enhanced.

Figure 6:
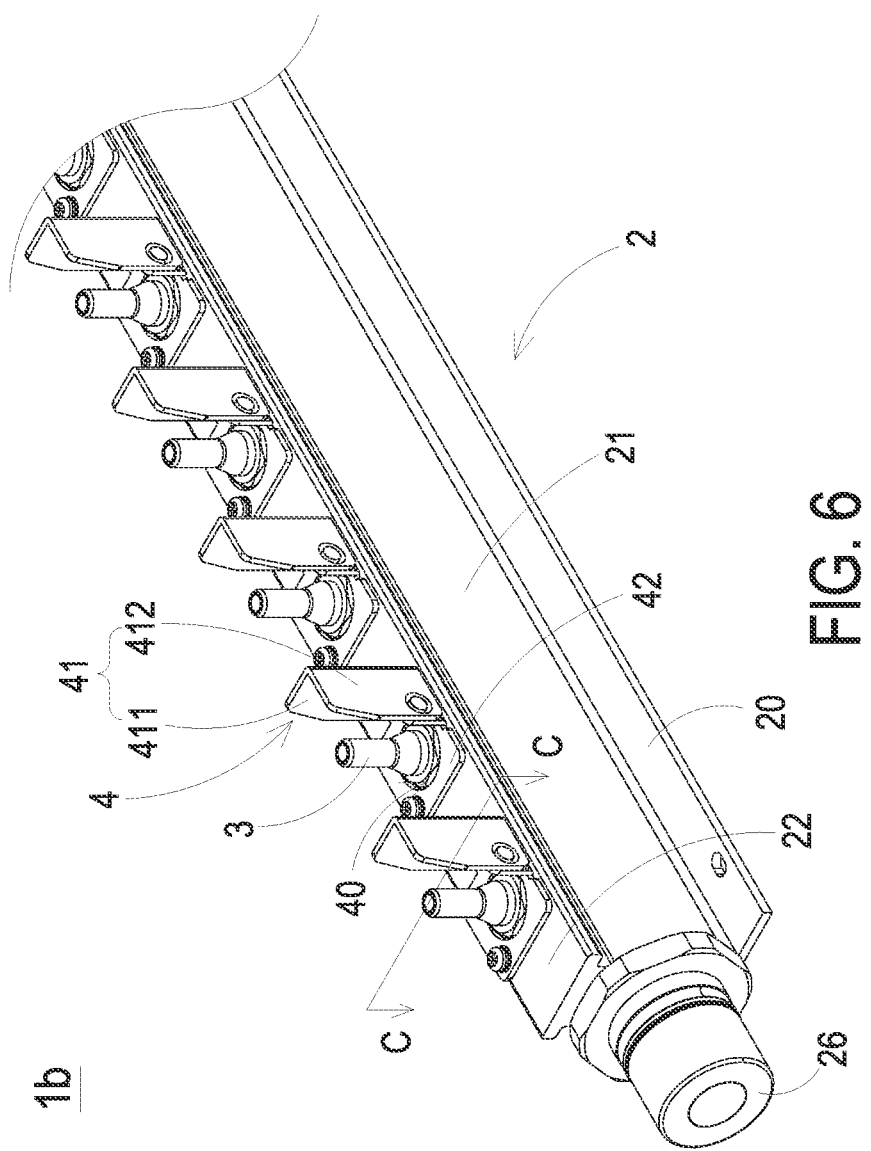
FIG. 6 is a partially enlarged schematic perspective view illustrating a liquid cooling manifold according to a third embodiment of the present disclosure.
Figure 7:
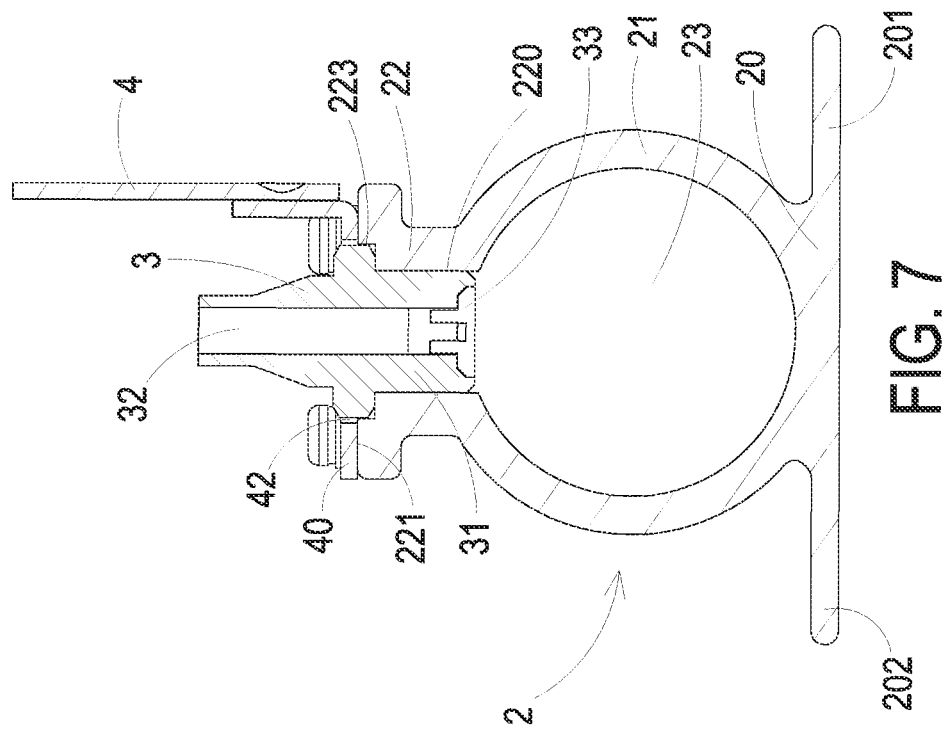
FIG. 7 is a schematic cross-sectional view illustrating the liquid cooling manifold of FIG. 6 and taken along the line C-C.
Figure 8:
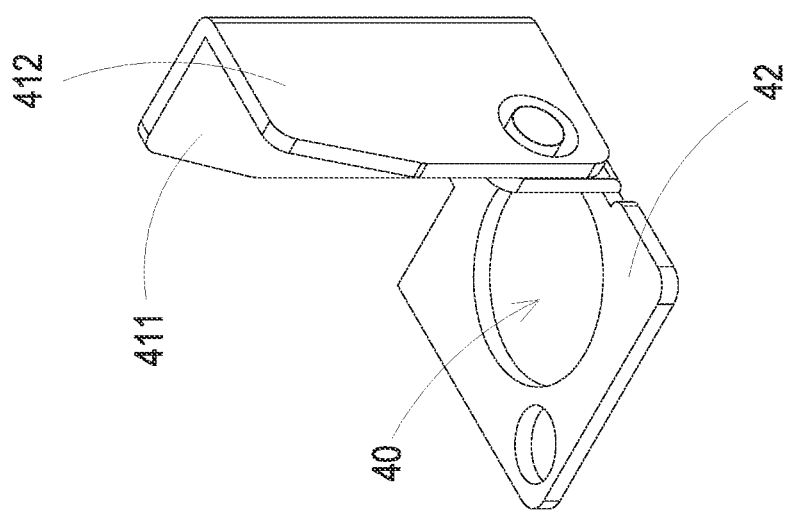
FIG. 8 is a schematic cross-sectional view illustrating a positioning device of FIG. 6.
Figure 9:
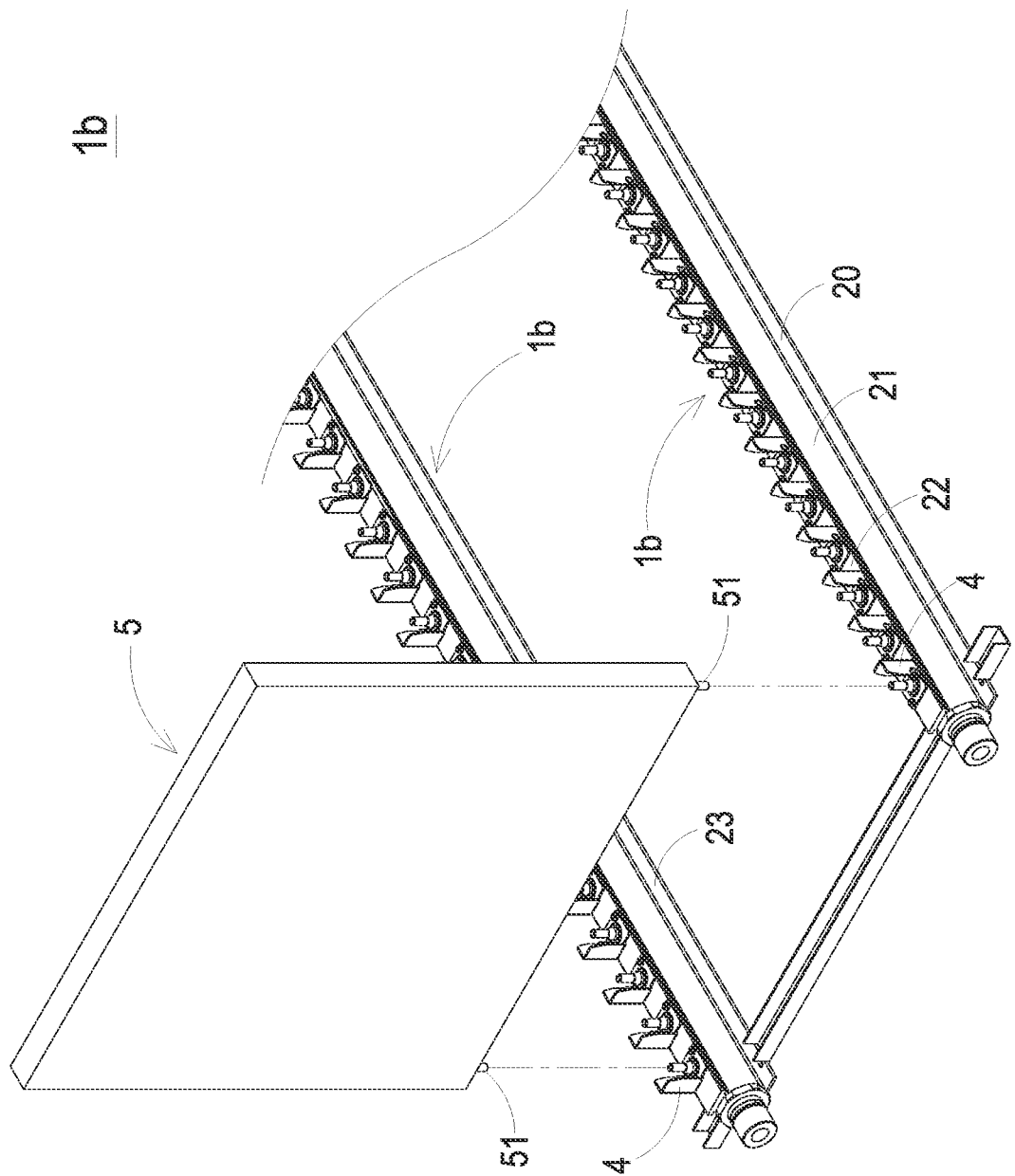
FIG. 9 is a schematic perspective view illustrating the liquid cooling manifold of FIG. 6 in connection with an electronic device.

FIG. 6 is a partially enlarged schematic perspective view illustrating a liquid cooling manifold according to a third embodiment of the present disclosure, FIG. 7 is a schematic cross-sectional view illustrating the liquid cooling manifold of FIG. 6 and taken along the line C-C, FIG. 8 is a schematic cross-sectional view illustrating a positioning device of FIG. 6, and FIG. 9 is a schematic perspective view illustrating the liquid cooling manifold of FIG. 6 in connection with an electronic device. As shown in FIGS. 6 to 9, the structures and functions of the liquid cooling manifold 1b of the third embodiment are similar to those of the liquid cooling manifold 1 shown in FIGS. 1 to 4. Component parts and elements corresponding to those of the first embodiment are designated by identical numeral references, and detailed descriptions thereof are omitted. In the embodiment, the liquid cooling manifold 1b further includes a plurality of positioning devices 4. The plurality of positioning devices 4 are disposed on the first surface 221 of the fixing portion 22 of the channel body 2. The plurality of positioning devices 4 are respectively disposed on and aligned with the corresponding one of the plurality of fixing openings 220, or respectively disposed on and aligned with the corresponding one of the plurality of recesses 223. Each of the positioning devices 4 includes a positioning portion 41 and a base 42. The base 42 is a square plate structure, and the positioning portion 41 is extended from the edge of the base 42 along the direction vertical to the base 42. The positioning portion 41 includes a first positioning plate 411 and a second positioning plate 412. The first positioning plate 411 and the second positioning plate 412 are vertically connected with each other. The base 42 has a perforation 40. The base 42 of the positioning device 4 is disposed on the first surface 221 of the fixing portion 22, and the perforation 40 of the base 42 is aligned to the corresponding one of the plurality of fixing openings 220 or the corresponding one of the plurality of recesses 223. The fluid connector 3 is positioned and fixed to the corresponding one of the plurality of fixing openings 220 by the auxiliary of the base 42 of the positioning device 4. The positioning portion 41 of the positioning device 4 is configured to guide and support a casing of an electronic device 5 while a matching fluid connector 51 of the electronic device 5 is assembled with the corresponding one of the plurality of fluid connectors 3, so that the fluid connector 3 is blind-mated and assembled with the matching fluid connector 51 of the electronic device 5. Consequently, the impact of accumulated tolerance caused by assembling is reduced, and the precision of the product is enhanced.

FIG. 10 is a partially enlarged schematic perspective view illustrating a liquid cooling manifold according to a fourth embodiment of the present disclosure, and FIG. 11 is a schematic perspective view illustrating the liquid cooling manifold of FIG. 10 in connection with an electronic device. As shown in FIGS. 10 and 11, the structures and functions of the liquid cooling manifold 1c of the fourth embodiment are similar to those of the liquid cooling manifold 1 shown in FIGS. 1 to 4. Component parts and elements corresponding to those of the first embodiment are designated by identical numeral references, and detailed descriptions thereof are omitted. In the embodiment, the liquid cooling manifold 1c further includes a plurality of positioning devices 6. The plurality of positioning devices 6 are disposed on the first surface 221 of the fixing portion 22 of the channel body 2. The plurality of positioning devices 6 are respectively disposed adjacent to the corresponding one of the plurality of fixing openings 220. Each of the positioning devices 6 is a pillar columnar structure. Each of the positioning devices 6 is disposed on the fixing portion 22 and fixed to a corresponding screw hole (not shown) of the fixing portion 22. Preferably, each of the positioning devices 6 is vertically disposed on the first surface 221 of the fixing portion 22. The positioning device 6 is configured to blind-mate with a corresponding positioning opening 52 of the electronic device 5. When a matching fluid connector 51 of the electronic device 5 is assembled with the corresponding one of the plurality of fluid connectors 3, the positioning device 6 is blind-mate with the positioning opening 52 of the electronic device 5, so that fluid connector 3 of the liquid cooling manifold 1c are guided to assemble with the matching fluid connector 51 of the electronic device 5. Consequently, the impact of accumulated tolerance caused by assembling is reduced, and the precision of the product is enhanced.

In summary, the present disclosure provides a liquid cooling manifold. By disposing the fixing portion of the channel body, the fluid connectors are fixed to the channel body directly, so that adapters used in the conventional liquid cooling manifold are omitted and the welding process needn't to be performed. Consequently, the thermal deformation caused by the welding process is avoided, the impact of accumulated tolerance is reduced, and the advantages of preventing liquid leakage and enhancing precision are achieved. The fluid connector of the liquid cooling manifold of the present disclosure is disposed on the fixing portion and fixed to the corresponding fixing opening of the fixing portion, so as to prevent the fluid connector form penetrating into the fluid channel. Consequently, the advantages of reducing the flowing resistance of the cooling liquid and enhancing the efficiency of heat dissipating are achieved. In addition, the port connector of the liquid cooling manifold of the present disclosure is tightly fitted in with the first end opening of the channel body, so that an adapter used in the conventional liquid cooling manifold is omitted and the welding process needn't to be performed. Consequently, the advantages of preventing leakage of the cooling liquid and enhancing precision are achieved. Moreover, the fluid connector of the liquid cooling manifold of the present disclosure are positioned and fixed to the corresponding fixing opening by the auxiliary of the positioning device, and a matching fluid connector of an electronic device is guided to assemble with the fluid connector of the liquid cooling manifold by the positioning device. Consequently, the impact of accumulated tolerance caused by assembling is reduced, and the accuracy of the product is enhanced.

While the disclosure has been described in terms of what is presently considered to be the most practical and preferred embodiments, it is to be understood that the disclosure needs not be limited to the disclosed embodiment.

What is claimed is:

1. A liquid cooling manifold for a liquid cooling system, configured to receive and transport a cooling liquid, the liquid cooling manifold comprising:
   a channel body comprising a base, a wall portion and a fixing portion, wherein the wall portion is connected between the base and the fixing portion, a fluid channel is formed among the wall portion, the base and the fixing portion, and the fluid channel allows the cooling liquid to flow therethrough, wherein the fixing portion includes a first surface and a plurality of fixing openings, and the plurality of fixing openings penetrate through the first surface and are respectively in fluid communication with the fluid channel; and
   a plurality of fluid connectors respectively disposed on the fixing portion and fixed to the corresponding one of the plurality of fixing openings and respectively in fluid communication with the fluid channel,
   wherein the channel body further comprises a plurality of heat-dissipating fins, and the plurality of heat-dissipating fins are extended outwardly from an out surface of the wall portion.

2. The liquid cooling manifold according to claim 1, wherein the wall portion comprises a first sidewall and a second sidewall, and the first sidewall and the second sidewall are respectively connected between the base and the fixing portion, wherein the first sidewall and the second sidewall have the same thickness.

3. The liquid cooling manifold according to claim 2, wherein the fixing portion has a thickness, the fluid connector comprises a fixing part, and the fixing part of the fluid connector has a length, wherein the thickness of the fixing portion is greater than the thickness of the first sidewall and the second sidewall, and the thickness of the fixing portion is greater than or equal to the length of the fixing part of the fluid connector.

4. The liquid cooling manifold according to claim 1, wherein the channel body further comprises a first end opening and a second end opening, and the first end opening and the second end opening are formed among the base, the wall portion and the fixing portion and are respectively in fluid communication with the fluid channel.

5. The liquid cooling manifold according to claim 4, further comprising a port connector, wherein the port connector is tightly fitted in with the first end opening, so that the port connector is fixed to the first end opening, wherein the port connector is served as an inlet or an outlet of the liquid cooling manifold for flowing the cooling liquid.

6. The liquid cooling manifold according to claim 4, further comprising a port cover, wherein the port cover is tightly in fitted with the second end opening, so that the port cover is fixed to the second end opening and seals the second end opening.

7. The liquid cooling manifold according to claim 1, wherein the channel body is a metal extrusion structure integrally formed in one piece, and is an elongated tube structure.

8. The liquid cooling manifold according to claim 1, wherein the base comprises a first extension portion and a second extension portion, and the first extension portion and the second extension portion are protruded from two opposite sides of the base, wherein a bottom surface of the base is coplanar with a bottom surface of the first extension portion and a bottom surface of the second extension portion.

9. The liquid cooling manifold according to claim 1, wherein the fixing portion further comprises a plurality of the recesses, the plurality of recesses are disposed on the fixing portion and are respectively corresponding in position to and in fluid communication with the corresponding one of the plurality of fixing openings, and a diameter of each of the plurality of the recesses is greater than a diameter of the corresponding one of the plurality of fixing openings.

10. The liquid cooling manifold according to claim 9, wherein the fluid connector further comprises a fixing ring, and the fixing ring is extended outwardly from a central portion of the fluid connector, wherein the fluid connector is fixed to the corresponding one of the plurality of fixing openings, and the fixing ring of the fluid connector is tightly fitted in with the corresponding one of the plurality of recesses, so as to seal the corresponding one of the plurality of fixing openings.

11. The liquid cooling manifold according to claim 1, further comprising a plurality of positioning devices, wherein the plurality of positioning devices are disposed on the first surface of the fixing portion of the channel body.

12. The liquid cooling manifold according to claim 11, wherein the plurality of positioning devices are respectively disposed on and aligned with the corresponding one of the plurality of fixing openings, wherein each of the plurality of positioning devices comprises a positioning portion and a base, the positioning portion is extended from an edge of the base along the direction vertical to the base, and the base has a perforation aligned to the corresponding one of the plurality of fixing openings.

13. The liquid cooling manifold according to claim 11, wherein the plurality of positioning devices are respectively disposed adjacent to the corresponding one of the plurality of fixing openings, wherein each of the plurality of positioning devices is a pillar structure configured to blind-mate with a corresponding positioning opening of an electronic device.

14. The liquid cooling manifold according to claim 1, wherein when the fluid connector is assembled with a matching fluid connector, the fluid connector is opened and allows the cooling liquid to pass through the fluid connector and the matching fluid connector, wherein when the fluid connector is disassembled from the matching fluid connector, the fluid connector is closed and limits the cooling liquid to pass through the fluid connector and the matching fluid connector.

15. The liquid cooling manifold according to claim 14, wherein each of the plurality of fluid connectors comprises a connecting channel and a valve, and the valve is configured to movably close an end of the connecting channel, wherein when the valve is pressed to be opened, the cooling liquid is allowed to pass through the fluid connector, wherein when the valve is returned to an original position to close the connecting channel, the cooling liquid is limited to pass through the fluid connector.

16. The liquid cooling manifold according to claim 1, wherein the number of the plurality of fluid connectors is the same as the number of the plurality of fixing openings of the fixing portion.

* * * * *